(12) United States Patent
Kim

(10) Patent No.: US 8,247,829 B2
(45) Date of Patent: Aug. 21, 2012

(54) LIGHT EMITTING DEVICE

(75) Inventor: Geun Ho Kim, Seoul (KR)

(73) Assignee: LG Innotek Co., Ltd., Seoul (KR)

( * ) Notice: Subject to any disclaimer, the term of this patent is extended or adjusted under 35 U.S.C. 154(b) by 181 days.

(21) Appl. No.: 12/567,155

(22) Filed: Sep. 25, 2009

(65) Prior Publication Data
US 2010/0078668 A1    Apr. 1, 2010

(30) Foreign Application Priority Data
Sep. 26, 2008  (KR) .................. 10-2008-0094485

(51) Int. Cl.
*H01L 33/00* (2010.01)
(52) U.S. Cl. ............ 257/98; 257/E33.061; 257/E33.059
(58) Field of Classification Search ............ 257/99–100, 257/467, 469–470, E33.061, E33.059
See application file for complete search history.

(56) References Cited

U.S. PATENT DOCUMENTS

| | | | |
|---|---|---|---|
| 6,573,537 B1* | 6/2003 | Steigerwald et al. | 257/103 |
| 7,306,967 B1* | 12/2007 | Kozhukh | 438/54 |
| 2005/0121686 A1* | 6/2005 | Keller et al. | 257/99 |
| 2005/0207459 A1* | 9/2005 | Yu et al. | 372/36 |
| 2007/0041185 A1 | 2/2007 | Yatsuda et al. | |
| 2008/0061717 A1 | 3/2008 | Bogner et al. | |
| 2009/0078960 A1* | 3/2009 | Wang et al. | 257/100 |

FOREIGN PATENT DOCUMENTS

| | | |
|---|---|---|
| CN | 1801497 A | 7/2006 |
| KR | 10-0609124 A | 6/2006 |
| KR | 10-2007-0053818 A | 5/2007 |

* cited by examiner

*Primary Examiner* — Matthew Reames
(74) *Attorney, Agent, or Firm* — Birch, Stewart, Kolasch & Birch, LLP

(57) ABSTRACT

Provided is a light emitting device. The light emitting device comprises a body, a light emitting diode on the body, a resistor integrated on the body and configured to sense a temperature of the light emitting diode, and a plurality of metal layers on the body.

15 Claims, 4 Drawing Sheets

LIGHT EMITTING DEVICE

CROSS-REFERENCE TO RELATED APPLICATIONS

The present application claims priority under 35 U.S.C. 119 to Korean Patent Application No. 10-2008-0094485 (filed on Sep. 26, 2008), which is hereby incorporated by reference in its entirety.

BACKGROUND

The present disclosure relates to a light emitting device.

A light emitting diode (LED) may constitute a light emitting source by using a chemical compound semiconductor material such as GaAs series, AlGaAs series, GaN series, InGaN series, and InGaAlP series.

This LED is packaged and used as a light emitting device for emitting various colors, and the light emitting device is used as a light source of diverse fields such as an on/off display for displaying colors, an alphanumeric display, an image display, etc.

SUMMARY

Embodiments provide a light emitting device comprising a resistor sensing a temperature of a light emitting diode and/or a body.

Embodiment provide a light emitting device capable of sensing a temperature, which is generated from a light emitting diode, by using a resistor formed on a body.

Embodiments provide a light emitting device comprising a resistor to sense a temperature integrated on or under a body.

Embodiment provide a light emitting device capable of adjusting power supply of a light emitting diode by sensing of a light emitting diode.

An embodiment provides a light emitting device comprising: a body; a light emitting diode on the body; a resistor integrated between the body and the light emitting diode and configured to sense a temperature of the light emitting diode; and a plurality of metal layers on the body.

An embodiment provides a light emitting device comprising: a body; a light emitting diode on the body; a resistor disposed under the body and configured to sense a temperature of the body; and a plurality of metal layers on the body.

An embodiment provides a light emitting device comprising: a body; a light emitting diode on the body; an insulation layer on the surface of the body; first and second metal layers electrically connected to the light emitting device and formed on the insulation layer; a resistor disposed to sense of temperature of the light emitting diode and formed on the insulation layer; and third and fourth metal layers electrically connected to the resistor, wherein one of the third and fourth metal layers is electrically connected to the body.

The details of one or more embodiments are set forth in the accompanying drawings and the description below. Other features will be apparent from the description and drawings, and from the claims.

DETAILED DESCRIPTION OF THE EMBODIMENTS

Figure 1:
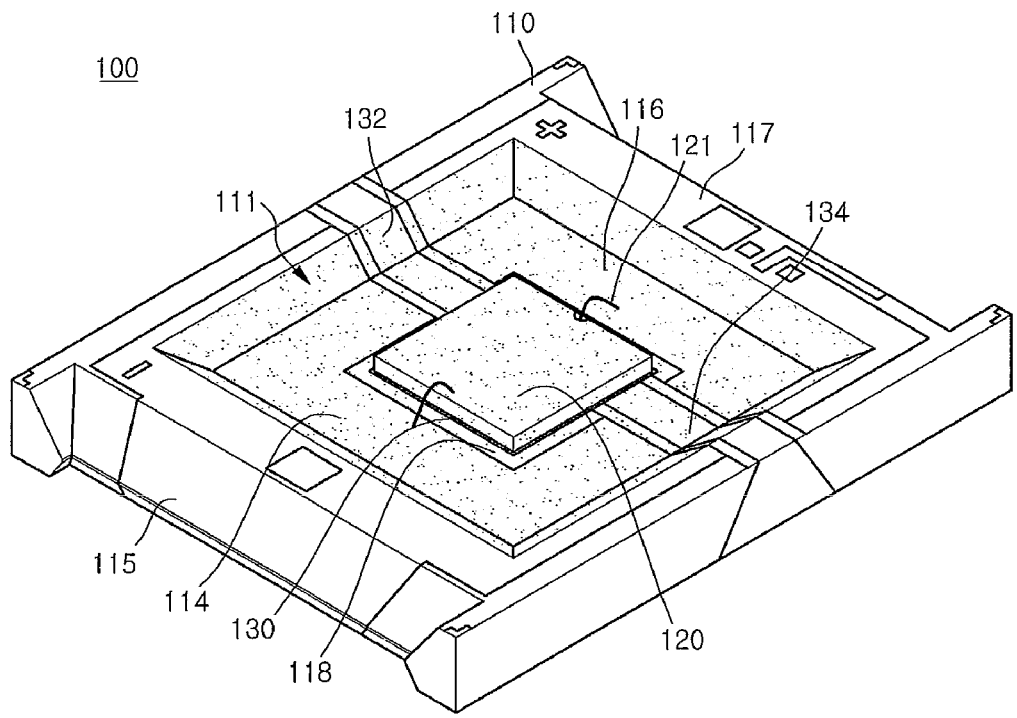
FIG. 1 is a perspective view of a light emitting device according to a first embodiment.

Hereinafter, embodiments are described as follows with reference to the accompanying drawings. In the description of the embodiments, the thickness of each component is just one example, and is not limited to the thickness in the drawings.

In the following description, it will be understood that when a layer or film is referred to as being 'on' another layer or substrate, it may be directly on another layer or substrate, or intervening layers may also be present. Further, it will be understood that when a layer is referred to as being 'under' another layer, it may be directly under another layer, and one or more intervening layers may also be present. In addition, it will also be understood that when a layer is referred to as being 'between' two layers, it may be the only layer between the two layers, or one or more intervening layers may also be present.

Figure 2:
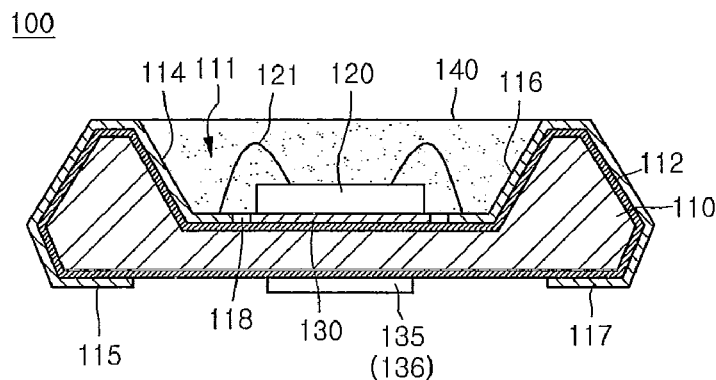
FIG. 2 is a horizontal cross-sectional view of FIG. 1.
Figure 3:
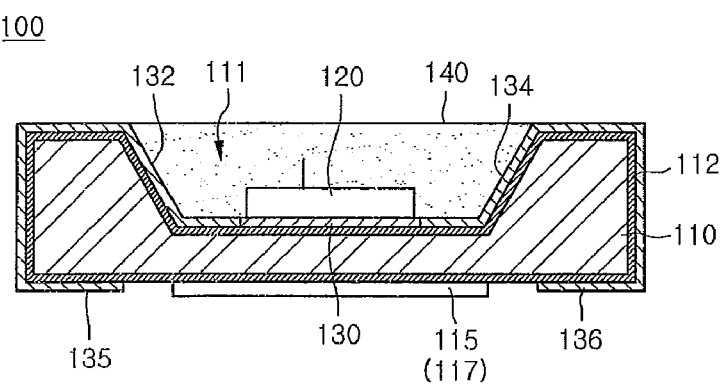
FIG. 3 is a vertical cross-sectional view of FIG. 1.

FIG. 1 is a perspective view of a light emitting device according to a first embodiment. FIG. 2 is a horizontal cross-sectional view of FIG. 1. FIG. 3 is a vertical cross-sectional view of FIG. 1.

Referring to FIGS. 1 to 3, a light emitting device 100 comprises a body 110, a cavity 111, a light emitting diode 120, a resistor 130, and a transparent resin 140.

The body 110 is formed of a silicon material (for example, silicon)-based wafer level package (WLP), and may have a frame of a polyhedron (for example, a rectangular parallelepiped).

The cavity 111 having a predetermined depth is formed in the top of the body 110, and its surface shape may be polygonal, circular, and oval. The cavity 111 may be formed with a predetermined depth through a dry etch or/and wet etch method, but is not limited to the mentioned form and depth.

The side of the cavity 111 may be formed to be slant, and the slanted side may improve a reflection amount of light. Additionally, the side of the cavity 111 may be formed to be vertical to its bottom, and is not limited to the mentioned side tilt angle.

The resistor 130 and the light emitting diode 120 are disposed in the cavity 111.

An insulation layer 112 is formed on the surface of the body 110. A metal layers 114, 116, 132, and 134 are formed on the surface of the insulation layer 112. Additionally, external electrode layers 115, 117, 135, and 136 are formed on the insulation layer 112.

The insulation layer 112 may be formed of an insulation material such as a silicon oxide, a silicon nitride, AlN, and SiC in order for insulation with respect to a conductive layer from the body 110 of a silicon material. The insulation layer 112 is formed between the body 110, the metal layers 114, 116, 132, and 134, and the external electrode layers 115, 117, 135, and 136 such that two materials are electrically insulated from each other.

The metal layers are divided first to fourth metal layers 114, 116, 132, and 134. The first and second metal layers 114 and 116 may be first internal electrode layers that are electrically connected to the light emitting diode 120. The third and fourth metal layers 132 and 134 may be second inner electrode layers that are electrically connected to the resistor 130. The metal layer may be a single layer or a multi layer, but is not limited thereto.

The first to fourth metal layers 114, 116, 132, and 134 in the cavity 111 may be formed of a metal material having a high reflectivity or a metal material having an excellent adhesiveness to a resin. If the first to fourth metal layers 114, 116, 132, and 134 are a multi layer, the most upper layer may be formed of at least one of metal materials such as Al, Ag, and APC (Ag+Pd+Cu).

The first and second metal layers 114 and 116 extend to a portion of the rear of the body 110 through the left/right side of the body 110, and are electrically connected to the first and second external electrode layers 115 and 117.

The third and fourth metal layers 132 and 134 extend to a portion of the rear of the body 110 through the front/back side of the body 110, and are electrically connected to the third and fourth external electrode layers 135 and 136.

The first to fourth external electrode layers 115, 117, 134, and 135 may be formed of an adhesive and a metal material having an excellent adhesiveness in order for electrical and/or mechanical coupling with substrate wirings during a surface mount technology (SMT) process. The first to fourth external electrode layers 115, 117, 134, and 135 may be formed of a single layer or a multi layer. In a case of the multi layer, the most upper layer may be formed of metal such as Au and Cu.

Figure 6:
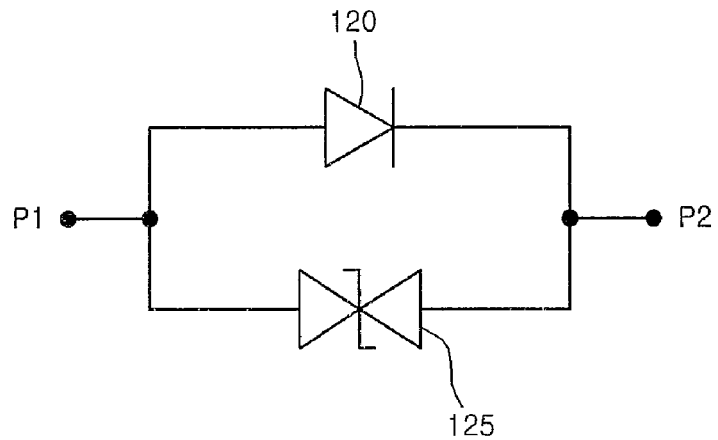
FIG. 6 is a circuit diagram illustrating a zener diode is additionally comprised in a light emitting device according to a first embodiment.
Figure 6:
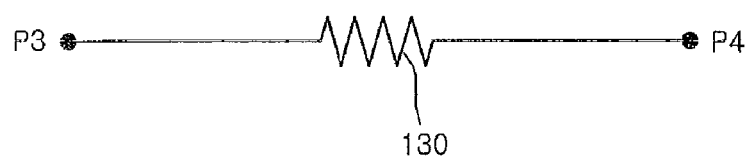

A zener diode 125 of FIG. 6 may be realized in the body 110. The body 110 is a board of a silicon material. After the insulation layer 112 is formed, a zener diode pattern is formed and then a diffusion process or an ion implantation process is performed to form the zener diode in the body 110. This zener diode may improve a withstand voltage of the light emitting diode 120.

The resistor 130 is integrated on the insulation layer 112 of the body 110 as a semiconductor thin layer. The resistor 130 senses or detects a heat conducted through the bottom of the light emitting diode 120.

The resistor 130 may be formed of a thin layer having a high temperature dependency (for example, a thin layer having a high temperature coefficient of resistance (TCR)), or may be formed to have a resistivity that satisfies a predetermined resistance value without difficulties. The thin film resistor may be formed of one of TaN, NiCr, Fe, Mn, Co, and Ni. Here, the TaN metal may be used to realize the thin film resistor that operates as a thermistor having a negative temperature coefficient (NTC) or positive temperature coefficient (PTC) characteristic. The thermistor may be formed to have the NTC characteristic in which a thin film resistance value is decreased as a temperature is increased, or the PTC characteristic in which a thin film resistance value is increased as a temperature is decreased. A transition metal such as Fe, Mn, Co, and Ni may be deposited using an oxide.

If the resistor 130 is a TaN thin layer, it is formed through a metal thin film depositing method using sputtering or evaporation on the surface of the insulation layer 112 and a patterning method using a photolithography and/or a resistor etching process. Or, another method of forming the resistor 130 comprises patterning a photo resist layer of a thin film resistor region through a photolithography on the insulation layer 112, depositing a metal thin film resistor, and removing the photo resist layer through a lift-off method. The method of forming the resistor 130 may be modified within the above-mentioned technical scope. The embodiment comprises a manufacturing process of the resistor using the TaN thin film and a manufacturing process of the resistor using another material within the technical scopes of the embodiment.

The resistor is attached to a portion bottom surface or an entire bottom surface of the light emitting diode.

The light emitting diode 120 may be attached on the resistor 130. The light emitting diode 120 may selectively comprise a colored LED (light emitting diode) chip and a UV (ultraviolet) LED chip. The colored LED chip comprises a blue LED chip, a green LED chip, and a red LED chip.

The light emitting diode 120 is connected to the first and second metal layers 114 and 116 through a wire 121. The resistor 130 is directly connected to the third and fourth metal layers 132 and 134. The light emitting diode 120 may be realized with a lateral semiconductor light emitting diode. In this case, the light emitting diode 120 is electrically connected to the first and second electrode layers 114 and 116 using a plurality of wires 121.

A short prevention layer 118 may be formed between the resistor 130 and the first and second metal layers 114 and 116.

A transparent resin 140 may be formed in the cavity 111 of the body 110. The transparent resin 140 comprises transparent epoxy or silicon material, or may comprise a phosphor for emitting a predetermined color. A lens may be formed on the transparent resin 140 and is not limited thereto.

The first embodiment integrates the resistor 130 under the light emitting diode 120 of the body 110, and thus can accurately sense or measure a temperature of the light emitting diode 120. The sensed temperature is provided to an LED driver (not shown), and thus can be used to control the light emitting diode 120. That is, the LED driver uses the temperature to effectively compensate for temperature and electrical characteristics of the light emitting diode 120. Accordingly, the light emitting diode 120 can have a uniform light emitting characteristic regardless of environmental changes.

Figure 4:
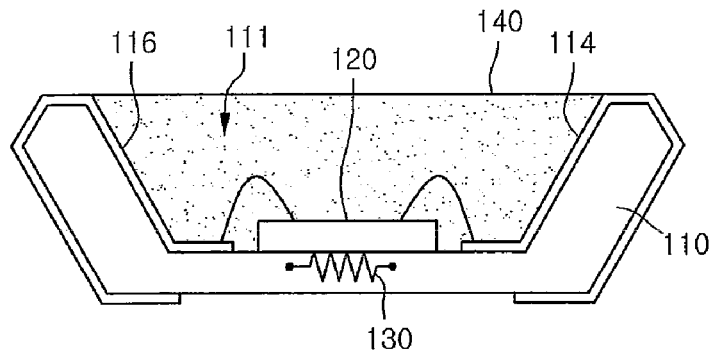
FIG. 4 is a view illustrating a circuit of a resistor in a light emitting device according to a first embodiment.

FIG. 4 is a view illustrating a circuit of a resistor in a light emitting device according to a first embodiment.

Referring to FIG. 4, a resistor 130 is integrated in a body 110, and a light emitting diode 120 is disposed on the resistor 130. The resistor 130 senses or measures a heat generated from the light emitting diode 120 and then provides it to an LED driver (not shown).

Accordingly, the LED driver (not shown) controls a current flowing through the light emitting diode 120 according to a temperature of the light emitting diode 120 such that a uniform light can be emitted regardless of a temperature of the light emitting diode 120.

Figure 5:
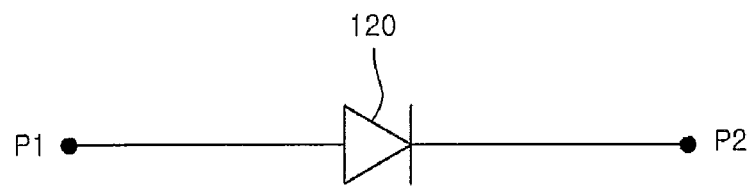
FIG. 5 is a circuit diagram illustrating that a light emitting diode and a resistor are separately disposed in a light emitting device according to a first embodiment.
Figure 5:
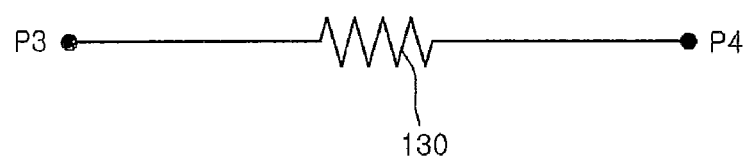

FIG. 5 is a circuit diagram illustrating that a light emitting diode and a resistor are separately disposed in a light emitting device according to a first embodiment.

Referring to FIG. 5, the both ends P1 and P2 of the light emitting diode 120 and the both ends P3 and P4 of the resistor 130 may be disposed to be electrically open. In this case, the resistor 130 senses or detects a heat conducted through the bottom of the light emitting diode 120.

FIG. 6 is a circuit diagram illustrating a zener diode is additionally comprised in a light emitting device according to a first embodiment.

Referring to FIG. 6, the light emitting diode 120 and the zener diode 125 are connected in parallel, and the light emitting diode 120 and the resistor 130 are disposed to be open to each other in a circuit. The zener diode 125 may be configured to have a single directivity or a bi-directivity, and thus can improve a withstand voltage of the light emitting diode 120.

Figure 7:
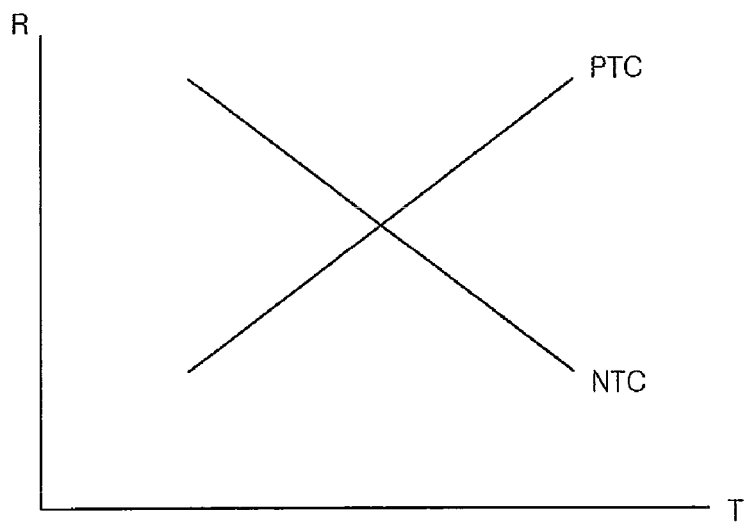
FIG. 7 is a graph illustrating a characteristic relationship between a temperature and a resistance of resistor according to a first embodiment.

FIG. 7 is a graph illustrating a characteristic relationship between a temperature and a resistance of a resistor according to a first embodiment.

Referring to FIG. 7, the resistor has a characteristic that its resistance R is increased proportional to a temperature T if the temperature is high when it operates according to a PTC characteristic, and that its resistance R is decreased inversely proportional to a temperature T if the temperature is high when it operates according to an NTC characteristic. This resistor may be manufactured to operate according to the PTC characteristic or the NTC characteristic.

FIGS. 8 to 11 are views illustrating a light emitting device manufacturing method according to a first embodiment.

Figure 8:
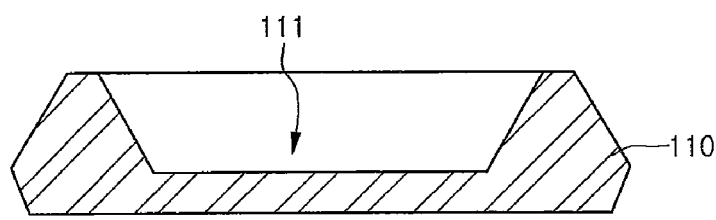
FIGS. 8 to 11 are views illustrating a light emitting device manufacturing method according to a first embodiment.

Referring to FIG. 8, a cavity 111 having a predetermined depth is formed in the top of a body 110. The body 110 comprises a silicon material. The cavity 111 may be formed through a wet etch or/and dry etch process. The wet etch may use a KOH solution, but is not limited thereto.

The surface shape of the cavity 111 may be polygonal, circular, and oval, but is not limited to those above shapes or depths.

The side of the cavity 111 may be slanted toward the outside with respect to an axis vertical to the bottom surface. The side of the cavity 111 may be formed to be vertical with respect to the bottom surface. This side inclination angle may vary according to efficiency of light, but is not limited thereto.

Figure 9:
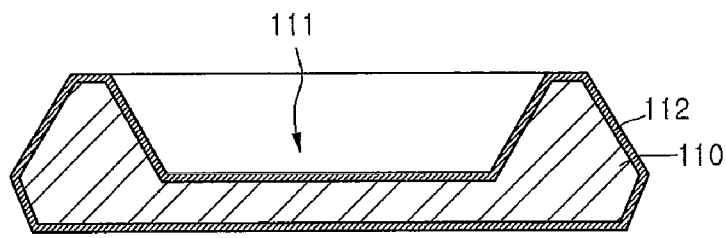
Figure 10:
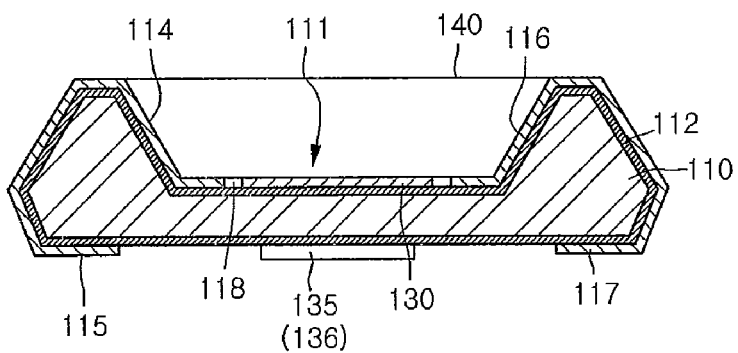

Referring to FIG. 9, an insulation layer 112 is formed on the surface of the body 110. The insulation layer 112 may be formed of an insulation material such as a silicon oxide, a silicon nitride, AlN, and SiC.

Referring to FIGS. 10 and 1 to 3, the metal layers 114, 116, 132, and 134, the external electrode layers 115, 117, 135, and 136, and the resistor 130 may be formed on the insulation layer 112. Here, after the metal layers 114, 116, 132, and 134 are formed, the resistor 130 can be formed. Or, after the resistor 130 is formed, the metal layers 114, 116, 132, and 134 can be formed.

The metal layers 114, 116, 132, and 134 are disposed to be open to each other. The first metal layer 114 and the second metal layers 116 are disposed to face each other. The third metal layer 132 and the fourth metal layers 134 are disposed to face each other.

The first to fourth metal layers 114, 116, 132, and 134 may be formed of a metal material having a high reflectance or an excellent adhesiveness with respect to a resin. Additionally, the first to fourth metal layers 114, 116, 132, and 134 may be formed of at least one of metals such as Al, Ag, and APC (Ag+Pd+Cu).

The first and second metal layers 114 and 116 extend to the bottom of the body 110 to be electrically connected to the first and second external electrode layers 115 and 117. The third and fourth metal layers 132 and 134 extent to the bottom of the body 110 to be electrically connected to the third and fourth external electrode layers 135 and 136. The first to fourth external electrode layers 115, 117, 135, and 136 may be formed of a single layer or a multi layer. In a case of the multi layer, the most upper layer may be formed of a metal such as Au and Cu.

The resistor 130 may be formed on the insulation layer 112 as a thin film resistor. The third metal layer 132 and the fourth metal layers 134 are electrically connected to the both ends of the resistor 130.

The thin film resistor may be formed of TaN, NiCr, Fe, Mn, Co, or Ni. This thin film resistor may be formed through a patterning method using a photolithography and/or a resistor etching process in the sputtering or evaporation. Additionally, the resistor 130 may be formed by patterning a photo resist layer in a region of the resistor 130 through a photolithography on the insulation layer 112, and then removing the photo resist layer using a lift-off method after a metal layer is deposited. A method of forming the resistor 130 may vary within the technical scopes. The embodiment comprises a manufacturing process of the resistor using the TaN thin film and a manufacturing process of the resistor using another material within the technical scopes of the embodiment.

Moreover, the thin film resistor may be formed of a thin layer having a high temperature dependency (for example, a thin layer having a high TCR), or may be formed to have a resistivity that satisfies a predetermined resistance value without difficulties. The thin film resistor may realize a thin film resistance that operates as a thermistor having an NTC or PTC characteristic according to a thin film deposition condition.

For example, the TaN thin layer may be formed through sputtering. Moreover, Ar gas and $N_2$ gas are injected together and then Ta metal reacts to $N_2$ gas, such that the TaN thin layer is deposited. In order to deposit a thin layer having a high TCR, an amount of $N_2$ gas is injected more in an aspect of a composition of Ar gas and $N_2$ gas.

A short prevention layer 118 is formed of an insulation material. The short prevention layer 118 is formed between the first metal layer 114 and the second metal layers 116, between the third metal layer 132 of FIG. 2 and the fourth metal layer 134 of FIG. 2, and around the resistor 130, such that electrical short can be prevented.

Figure 11:
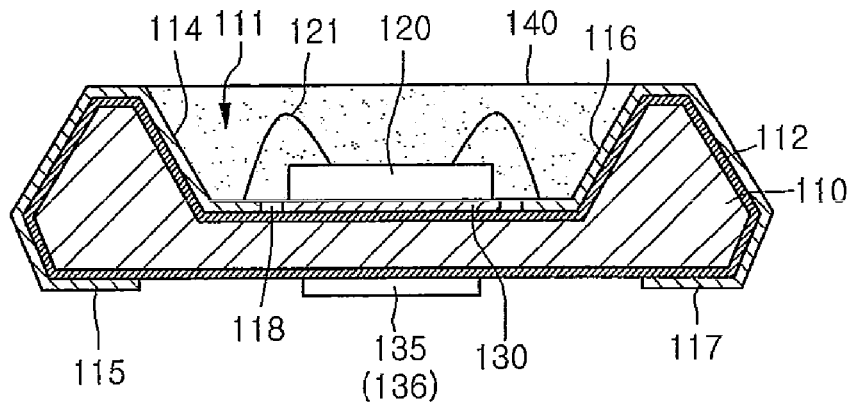

Referring to FIG. 11, the light emitting diode 120 is attached to the resistor 130 using an adhesive, and the adhesive may be used as a non-conductive material. The light emitting diode 120 may comprise at least one of a colored LED chip and an UV LED chip, but is not limited thereto.

The light emitting diode 120 is connected to the first and second metal layers 116 and 114 through the wire 121. The size of the resistor 130 may be greater or less than the bottom size of the light emitting diode 120, but is not limited thereto.

The transparent resin 140 is formed in the cavity 111. The transparent resin 140 comprises transparent epoxy or silicon material. If necessary, at least one kind of a phosphor can be added.

In the light emitting device 100, when the light emitting diode 120 is driven, a heat is generated. The resistor 130 measures or senses a temperature generated from the light emitting diode 120, and then transmits it to an LED driver. The LED driver adjusts a current applied to the light emitting diode 120 by using the measured or sensed temperature. Accordingly, the light emitting diode 120 emits a uniform light without being affected by the temperature.

Additionally, a light emitting module may array the light emitting device 100 on a substrate, and each light emitting device 100 measures or senses a temperature of the light emitting diode 120 using the resistor 130 therein and transmits it. Accordingly, characteristics of the entire light emitting device constituting a light emitting module can be consistently maintained by controlling each current, which is applied to the light emitting diode 120 in each light emitting device 100.

Figure 12:
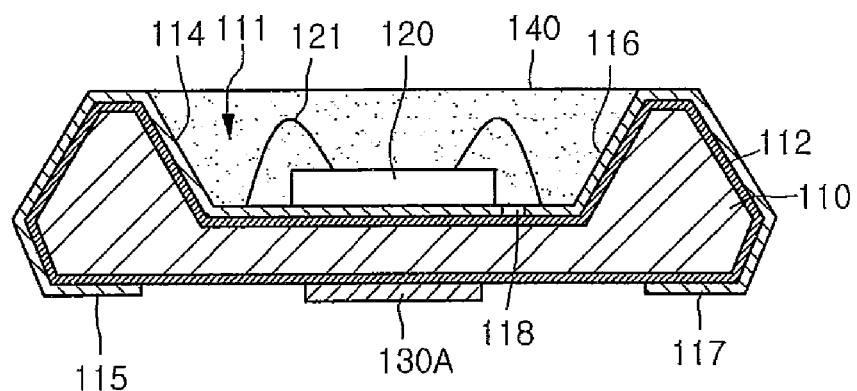
FIG. 12 is a cross-sectional view illustrating a light emitting device according to a second embodiment.

FIG. 12 is a cross-sectional view illustrating a light emitting device according to a second embodiment. While the second embodiment is described, the same components as the first embodiment are given with the same reference number, and overlapping description will be omitted.

Referring to FIG. 12, according to a light emitting device 100A, a light emitting diode 120 is disposed in a cavity 111 of a body 110, and a resistor 130A is integrated on the bottom of the body 110. The resistor 130A measures a temperature transmitted from the light emitting diode 120 through the body 110 and then transmits it to an LED driver. A process of manufacturing the resistor 130A on the rear of the body 110 will refer to the first embodiment.

According to the embodiment, the resistor 130A is integrated on the bottom of the body 110 to accurately measure a temperature of the light emitting diode 120. Therefore, temperature and electrical characteristics of the light emitting diode 120 can be effectively compensated. Additionally, regardless of external environmental changes, the light emitting diode 120 can be controlled to have a uniform light emitting characteristic.

The both ends of the resistor 130A may be disposed on the both ends of the bottom of the body 110, but is not limited thereto. The resistor 130A is connected to a metal layers (not shown) which is electrically connected to the body.

Figure 13:
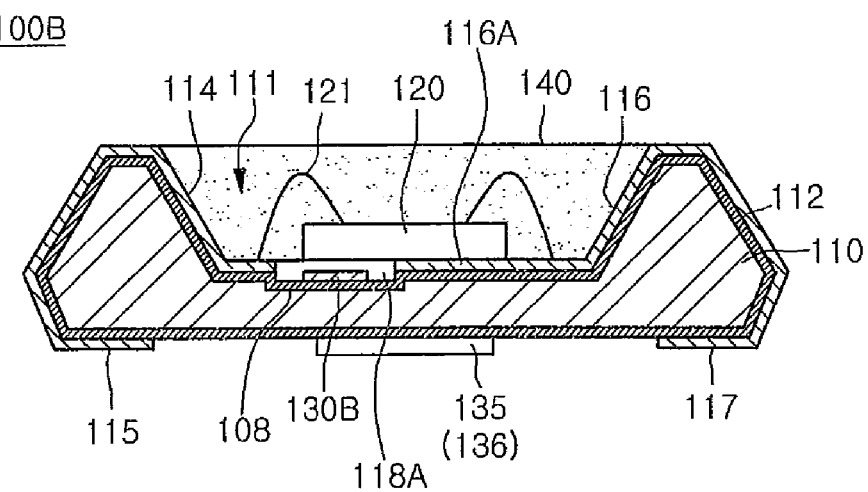
FIG. 13 is a cross-sectional view illustrating a light emitting device according to a third embodiment.

FIG. 13 is a cross-sectional view illustrating a light emitting device according to a third embodiment. While the third embodiment is described, the same components as the first embodiment are given with the same reference number, and overlapping description will be omitted.

Referring to FIG. 13, a light emitting device 100B has a structure where the bottom surface of the cavity 111 of the body 110 has a stepped groove 108.

An insulation layer 112 is formed on the surface of the body 110 comprising the stepped groove 108, and the resistor 130B is formed on an insulation layer 118 in a region of the stepped groove 108. A method of forming the resistor 130B will refer to the first embodiment.

A short prevention layer 118A is formed on a circumference region except for metal layers at the both ends of the resistor 130B. The short prevention layer 118A may electrically insulate the resistor 130B from the first and second metal layers 114 and 116.

Here, since the resistor 130B is disposed under the light emitting diode 120, a heat emitted from the light emitting diode 120 can be measured, detected, or radiated.

The top surface of the short prevention layer 118A is formed of the same plane as the first and second metal layers 114 and 116, and the light emitting diode 120 is mounted on the short prevention layer 118A and the second metal layer 116 using a conductive adhesive.

At this point, the light emitting diode 120 is a vertical semiconductor light emitting diode. A bottom electrode of the light emitting diode 120 may be attached on the second metal layer 116 through a solder and a top electrode of the light emitting diode 120 may be connected to the first metal layer 114 through a wire 121.

The light emitting diode 120 may be disposed to be parallel. Since the surfaces of the short prevention layer 118A and the second metal layer 116 are formed on the same plane, the light emitting diode 120 can be disposed to be parallel. In this case, even if the size of the resistor 130B is reduced, limitations due to a stepped structure can be prevented.

An embodiment provides a method of manufacturing a light emitting device comprising: forming an insulation layer on the surface of the body; forming a plurality of metal layers on the insulation layer; forming a resistor on the insulation layer; and attaching a light emitting device on the resistor.

According to the embodiment, a resistor is integrated on a body, such that a light emitting device capable of accurately sensing a temperature of a light emitting diode can be provided.

The embodiments can effectively compensate for temperature characteristic of a light emitting device.

The embodiments provide a light emitting device and a light emitting module having a uniform light emitting characteristic regardless of an external environment change.

The embodiments maintain characteristics of an entire LED devices constituting a light emitting module.

The embodiments provide an LED package.

The embodiments provide an LED package resistant to a temperature.

The embodiments can be used as a light source such as a display device, a streetlight, and a lighting device.

The embodiments can improve reliability of an LED package.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

Any reference in this specification to "one embodiment," "an embodiment," "example embodiment," etc., means that a particular feature, structure, or characteristic described in connection with the embodiment is included in at least one embodiment of the invention. The appearances of such phrases in various places in the specification are not necessarily all referring to the same embodiment. Further, when a particular feature, structure, or characteristic is described in connection with any embodiment, it is submitted that it is within the purview of one skilled in the art to effect such feature, structure, or characteristic in connection with other ones of the embodiments.

Although embodiments have been described with reference to a number of illustrative embodiments thereof, it should be understood that numerous other modifications and embodiments can be devised by those skilled in the art that will fall within the spirit and scope of the principles of this disclosure. More particularly, various variations and modifications are possible in the component parts and/or arrangements of the subject combination arrangement within the scope of the disclosure, the drawings and the appended claims. In addition to variations and modifications in the component parts and/or arrangements, alternative uses will also be apparent to those skilled in the art.

What is claimed is:

1. A light emitting device comprising:
a body comprising a cavity;
a light emitting diode disposed in the cavity;
a resistor disposed between the body and the light emitting diode and configured to sense a temperature of the light emitting diode;
a groove formed in a portion of a bottom surface of the cavity and including the resistor therein; and
a plurality of metal layers on the body,
wherein the lower surface of the light emitting diode is attached to an upper surface of the resistor on the body.

2. The light emitting device according to claim 1, wherein the body comprises a silicon material.

3. The light emitting device according to claim 1, comprising an insulation layer between the surface of the body and the plurality of metal layers.

4. The light emitting device according to claim 3, wherein the insulation layer is formed between the body and the resistor.

5. The light emitting device according to claim 1, wherein the resistor is formed of a semiconductor thin film resistor or a transition metal.

6. The light emitting device according to claim 1, wherein the resistor is a material selected from the group consisting of TaN, NiCr, Fe, Mn, Co, and Ni.

7. The light emitting device according to claim 1, comprising a zener diode disposed in the body and diffused on the body.

8. The light emitting device according to claim 1, wherein the cavity comprises a transparent resin or a phosphor-added transparent resin.

9. The light emitting device according to claim 3, wherein the plurality of metal layers comprises a first metal layer, a second metal layer, a third metal layer, and a fourth metal layer, the first and second metal layers being electrically connected to the light emitting diode, the third and fourth metal layers being electrically connected to the resistor.

10. The light emitting device according to claim 9, wherein the third and fourth metal layers are disposed between the first and second metal layers, and a portion of the first to fourth metal layers are disposed on a side surface of the body.

11. A light emitting device comprising:
a body;
a light emitting diode on the body;
an insulation layer on the surface of the body;
first and second metal layers electrically connected to the light emitting diode and formed on the insulation layer;
a resistor disposed to sense of temperature of the light emitting diode and formed on the insulation layer; and
third and fourth metal layers electrically connected to the resistor, wherein one of the third and fourth metal layers is electrically connected to the body.

12. The light emitting device according to claim 11, wherein the resistor is integrated on or under the body.

13. The light emitting device according to claim 1, wherein the upper surface of the resistor has a different size from a size of the lower surface of the light emitting diode.

14. The light emitting device according to claim 1, wherein at least one of the plurality of metal layers is disposed on a side surface of the body.

15. The light emitting device according to claim 11, wherein the resistor is a material selected from the group consisting of TaN, NiCr, Fe, Mn, Co, and Ni.

* * * * *